United States Patent
Morimoto et al.

[11] Patent Number: 5,818,169
[45] Date of Patent: Oct. 6, 1998

[54] HIGH POWER MERCURY LAMP OF THE SHORT ARC TYPE WITH SPECIFIC CATHODE DESIGN AND PROCESS FOR OPERATION THEREOF

[75] Inventors: Shinkichi Morimoto; Kiyotada Nakamura; Toshiyuki Shima; Osamu Inoue, all of Himeji, Japan

[73] Assignee: Ushiodenki Kabushiki Kaisha, Tokyo, Japan

[21] Appl. No.: 670,695

[22] Filed: Jun. 26, 1996

[30] Foreign Application Priority Data

Jun. 26, 1995 [JP] Japan ................................. 7-180581

[51] Int. Cl.⁶ ........................................ H01J 61/04
[52] U.S. Cl. .......................... 313/631; 313/574; 313/632; 313/571
[58] Field of Search ..................... 313/631, 574, 313/632, 491, 571, 620, 352, 357

[56] References Cited

U.S. PATENT DOCUMENTS

| 3,517,248 | 6/1970 | Eckel | 313/620 |
| 4,799,135 | 1/1989 | Inukai et al. | 313/620 |
| 4,988,918 | 1/1991 | Mori et al. | 313/620 |
| 5,258,691 | 11/1993 | Dakin et al. | 313/620 |
| 5,539,273 | 7/1996 | Sims | 313/631 |

FOREIGN PATENT DOCUMENTS 0953522 12/1949 France ................. 313/620

Primary Examiner—Jay M. Patidar
Attorney, Agent, or Firm—Sixbey, Friedman, Leedom & Ferguson; David S. Safran

[57] ABSTRACT

A lamp in which a stable, long-term luminous operation can be accomplished is achieved by the fact that, in a mercury lamp of the short arc type in which a cathode and an anode located next to one another within an arc tube and in which both ends of the arc tube are provided with hermetically sealed portions, the cathode is installed on the tip of a rod-shaped component which extends from a respective one of the hermetically sealed portions, the cathode having a greater outer diameter than the rod-shaped component on which it is installed, and the rear end of the cathode tapering toward the respective hermetically sealed portion.

5 Claims, 3 Drawing Sheets

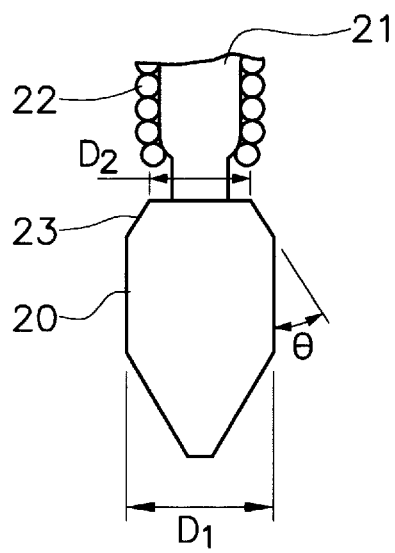
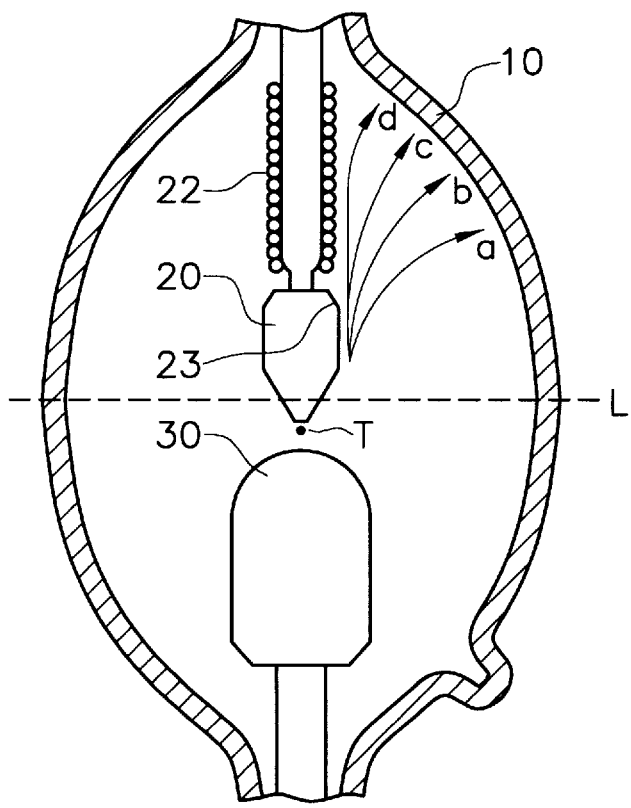

HIGH POWER MERCURY LAMP OF THE SHORT ARC TYPE WITH SPECIFIC CATHODE DESIGN AND PROCESS FOR OPERATION THEREOF

BACKGROUND OF THE INVENTION

1. Field of the invention

The invention relates to a mercury lamp of the short arc type. The invention relates especially to a mercury lamp of the short arc type which is used as a light source of a semiconductor exposure device which is operated with high power.

2. Description of Related Art

A mercury lamp of the short arc type in which mercury and inert gas are encapsulated is used for a device for exposing a semiconductor wafer. In the center this lamp is an emission portion, having the approximate shape of a U.S. football or rugby ball, within which there are a cathode and an anode located next to one another with an arc gap across which an arc discharge is formed between the cathode and the anode. The tip of the cathode has a conical shape and the tip of the anode has roughly hemispherical shape in order that a discharge of this type can be advantageously accomplished.

Mercury lamps which are used for this purpose have mainly a luminous power from 1 KW to 5 KW, for low power lamps, cathodes being used in which the tips of rod-shaped components have been worked into a conical shape and which are mounted in the lamp so as to extend away from hermetically sealed portions thereof. On the other hand, in lamps with relatively high powers of greater than or equal to roughly 1.4 KW, on the tips of the rod-shaped components which extend from the hermetically sealed portions, cathodes are installed with outside diameters which are greater than these rod-shaped components. The reason for this is to reduce the load, since the load which is exerted on the cathode becomes greater when the power rises.

On the other hand, this mercury lamp of the short arc type is arranged vertically in an exposure device and is operated such that the cathode is pointed down and the anode is pointed up. This is because, during a lighting operation, the anode reaches a higher temperature than the cathode; this causes convection of the encapsulated gas within the arc tube.

This convection is described specifically below:

The encapsulated gas which has been heated rises from one side of the anode, passes through the peripheral area of the arc, and continues to flow along one side of the cathode. On the other hand, the conical shape controls the direction of convection, since the tip of the cathode has been worked to be conical. This controlled gas collides with the inside of the arc tube according to the angle of the cone. Since this collision of the gas with the inside of the arc tube takes place locally, adhesion of a blackened substance occurs there.

With regard to this blackened substance, adhesion of the components of the encapsulated gas, i.e., of the mercury and of the inert gas, occasionally occurs; however, more frequently, adhesion of the material occurs which comprises the electrodes, for example, tungsten, or the like. This is because the electrodes, during luminous operation of the lamp, reach a high temperature of for example 2000° C. and as a result vaporization occurs. Due to this adhesion of the blackened substance, the disadvantage arises that the radiant light from the lamp is turned off and that exposure with a sufficient illumination intensity cannot be performed.

In a mercury lamp of the short arc type which is used for a conventional semiconductor exposure device, use for roughly 100 hours is desired. After this use, it has been assumed that the end of the service life of the lamp has been reached and a new lamp installed in the device.

On the other hand, the above described blackened substance hardly occurs after roughly 100 hours of luminous operation. This means that the above described disadvantage has not occurred. However, recently there has been an increased demand for use of mercury lamps for a longer time, and a luminous lifetime of, for example, 1000 hours is desired. This means that there is a demand for a lamp in which the radiation intensity can be adequately maintained up to about 10 times longer than the previously known lamp.

SUMMARY OF THE INVENTION

Therefore, a primary object of the present invention is to devise a lamp in which stable luminous operation can be accomplished for a long time.

According to a preferred embodiment of the invention, this object is achieved in a mercury lamp of the short arc type by the fact that, a cathode and an anode are located next to one another within an arc tube, both ends of which are provided with hermetically sealed portions, that the cathode is installed on the tip of a rod-shaped component which extends from a respective one of the hermetically sealed portions, that the outside diameter of the cathode is greater than the outside diameter of this rod-shaped component, and that the back end of the cathode has a form which tapers toward the respective hermetically sealed portion.

The object of the invention is furthermore achieved by the taper of the cathode being in range from 20° to 40°.

The object of the invention is achieved, moreover, by the arc tube having a roughly rugby ball shape, i.e., an oval with ends that are tapered instead of rounded, and by the tip of the cathode projecting passed the center of the arc tube into the anode side of the arc tube in the direction in which the electrodes extend.

The object of the invention is additionally achieved by the rod-shaped component being wound with a tungsten coil.

The inventors have found by intensive studies with repeated tests that by placing a taper on the back end of the cathode the convection of the encapsulated gas can be changed within the arc tube. The inventors have been successful by means of this change in producing adhesion of the blackened substance in the vicinity of the respective hermetically sealed portion which does not directly contribute to the exposure.

Furthermore, the inventors have found that by means of the measure by which the angle of this taper is in the range from 20° to 40°, the blackened substance can be most effectively produced in the vicinity of the hermetically sealed portion.

The inventors have also found that the effect can be enhanced by the tip of the cathode projecting passed the center of the arc tube into the anode side in the direction in which the electrodes extend.

In addition the inventors found that by winding one portion with a smaller diameter of the cathode using a tungsten coil, the impurity gasses can be adsorbed and the formation of the blackened substance can be inherently suppressed.

These and further objects, features and advantages of the present invention will become apparent from the following description when taken in connection with the accompanying drawings which, for purposes of illustration only, show a single embodiment in accordance with the present invention.

BRIEF DESCRIPTION OF THE DRAWINGS

FIG. 2 is an enlarged view of the cathode of the mercury lamp shown in FIG. 1;

FIG. 3 is an enlarged view of an emission portion the arc tube of the FIG. 1 lamp showing the relation between the flow of the air and blackened substance within the mercury lamp.

DETAILED DESCRIPTION OF THE PREFERRED EMBODIMENT

Figure 1:
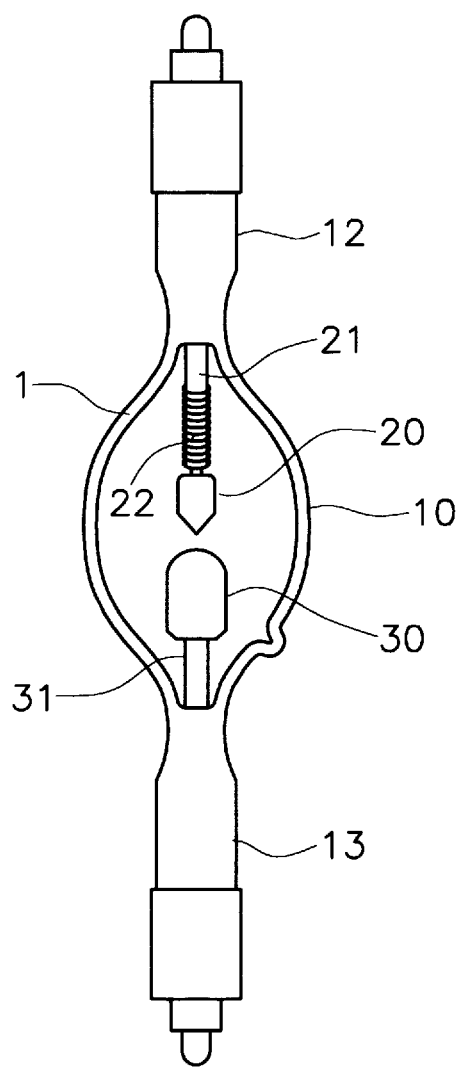
FIG. 1 is a schematic view a mercury lamp of the short arc type according to the invention.

FIG. 1 schematically shows the mercury lamp of the short arc type according to the invention in which a quartz glass arc tube 1 has an emission portion 10 in its center. On each end of emission portion 10 is a respective hermetically sealed portion 12, 13. Within the emission portion 10, a cathode 20 and an anode 30 are each held by a rod-shaped component 21, 31 which extends from a respective one of the hermetically sealed portions 12, 13. The cathode 20 and anode 30 are located in opposition to one another with a discharge gap being formed therebetween roughly in the center of emission portion 10.

In hermetically sealed portions 12 and 13, there are metal foils and outer lead pins which are not shown in the drawing and which are connected electrically to rod-shaped components 21 and 31, in a manner that is known in the art. The quartz glass which forms the outer tube of emission portion 10 and rod-shaped components 21 and 31 are bonded to one another at the bases of emission portion 10 at the hermetically sealed portions 12 and 13, by which a sealed arrangement of the inside of emission portion 10 is produced.

Emission portion 10 is made roughly in the shape of a rugby ball, i.e., an oval shape with ends that are tapered instead of rounded, and within which an emission space formed. Within the emission space formed with the emission portion 10, a mixture of mercury and inert gas are encapsulated. For example, mercury, in an amount of 20 mg/cc with reference to the inside volume of the emission portion, and xenon gas, as the inert gas in an amount producing a pressure of 40 hPa, are encapsulated. The inner volume of emission portion 10 is, for example, 180 cc and the distance between the cathode and the anode is roughly 6 mm. The tip of the cathode 20 is conically shaped, and the tip of anode 30 is hemispherically shaped. This mercury lamp is operated, for example, with an illuminating voltage of 58 V, an illuminating current of 60 A and an illuminating power of 3500 W.

FIG. 2 schematically shows the cathode 20 in an enlarged view. The rod-shaped component 21 has, for example, a diameter of 6 mm and is made of tungsten. The periphery of component 21 is wound with a coil 22 of that is also made of tungsten. This coil 22, for example, has a wire diameter of 1.5 mm and a length of 25 mm and is wound about rod-shaped component 21 roughly 17 times.

Cathode 20, for example, has an outer diameter D1 of 10 mm and an outer diameter D2 of 7 mm. Cathode 20 is made of tungsten, within which an electron emitting material, such as thorium or the like, has been added. The tip of the cathode has a frusto-conical shape with a flat tip to increase electron emission. On the other hand, a taper 23 is formed on the end of the cathode 20 which is directed toward rod-shaped component 21, this taper being shown in FIG. 2 as forming an "angle of taper" $\theta$ which is, for example, an angle of 30° as represented in the drawing.

Here, the interior of emission portion 10 has a hermetically sealed arrangement as was described above. During luminous operation of the lamp, in this space, convection forms with a flow direction which is determined by the complex action of the temperature of the electrodes, the size of the electrodes, and the distance between the electrodes, or the like.

However, according to the invention, it was found that, among these factors, the arrangement of the taper on the rear end of cathode 20 with respect to the introduction of gas to the top, i.e., in the direction toward the base of rod-shaped component 21, becomes a rather large factor. This means that it was found that the air flow which rises, due to heating, from the vicinity of the anode to along the side of the cathode without the direction being established by the conical shape of the tip of the cathode, and the air flow at the base of the rod-shaped component which supports the cathode can collide with the arc tube.

The above described state of affairs is described below using FIG. 3.

The air flow which rises along the side of cathode 20 flows in the directions to a, b, c and d, as is shown in FIG. 3 of the drawings. Here, it was found that establishing angle $\theta$ of taper 23 can contribute heavily to an increase in the proportion of the gas which flows in direction d.

In the following, the test results are described using the table in which the relation between the angle of taper $\theta$ and the direction of the air flow is indicated.

| TAPER ANGLE $\theta$ | AIR FLOW | EVALUATION |
|---|---|---|
| 0° | a | hardly any effect |
| 10° | a | hardly any effect |
| 20° | c | effective |
| 30° | d | major effect |
| 40° | c | effective |
| 50° | b | only a small effect |
| 60° | b | only a small effect |
| 70° | b | only a small effect |
| 80° | a | hardly any effect |

In the experiment, lamps were used in which the taper angle $\theta$ was changed. The lamps were each operated for roughly one hour, during which air flow was observed within emission portion 10. As a result of this air flow, the adhesion position of the blackened substance was assumed to be on the inside wall of the arc tube. This is because the flow of air can be easily visually monitored using sunglasses, although the formation of the blackened substance requires a very long period of illumination, as was described above. In the evaluation, it was evaluated as "the more effective", the nearer to the base of emission portion 10, i.e. the nearer to hermetically sealed portion 12, the air flow has risen.

In the test, mercury lamps as shown in FIG. 1 were operated with 58 V and 3500 W. However, an essentially identical effect can be obtained when the mercury lamp has a power of greater than at least 1 KW.

As the results indicate, the adhesion of the blackened substance in the vicinity of the base of emission portion 10 can be produced when the taper angle $\theta$ lies within the range from 20° to 40°.

On the other hand, in a semiconductor exposure device, production of the blackened substance outside the above described specified angular range, in the final effect, enables exposure over a long time since, in use of the exposure device, only a portion of the radiant light from the lamp which is emitted inside a certain angular range around the arc bright spot contributes to exposure.

Furthermore, in the mercury lamp according to the invention, by winding the rod-shaped component 21 with tungsten coil 22, the impurities contained in the air flow, such as tungsten and the like, can be advantageously absorbed if the air flow proceeds through the periphery of coil 22. This means that the amount of blackened substance which adheres to the inside of emission component 10 can be reduced.

FIG. 3 shows a state in which, in the interior of emission portion 10, the arc bright spot T which is formed on the tip of cathode 20 is positioned beyond the center L of the lamp, towards the cathode 30 in the electrode direction. By this positioning of arc bright spot T beyond center line L, the light which is emitted from arc bright spot T can also be moved entirely downward. This means that it is becomes possible for the effective radiant light which contributes directly to exposure to be pushed entirely downward, the position of the lamp being fixed.

This means that a wide extent of the emission component 10 is free of obstacle and can be used for exposure, even if adhesion of the blackened substance occurs on the cathode side of emission portion 10. Together with the invention of the above-mentioned taper, a synergistic prolongation of the service life of the lamp can be achieved. Specifically, the tip of cathode 20 has a projection of 3 mm down from center line 4. Tests have shown that the desired projection is 1 to 6 mm.

Figure 4:
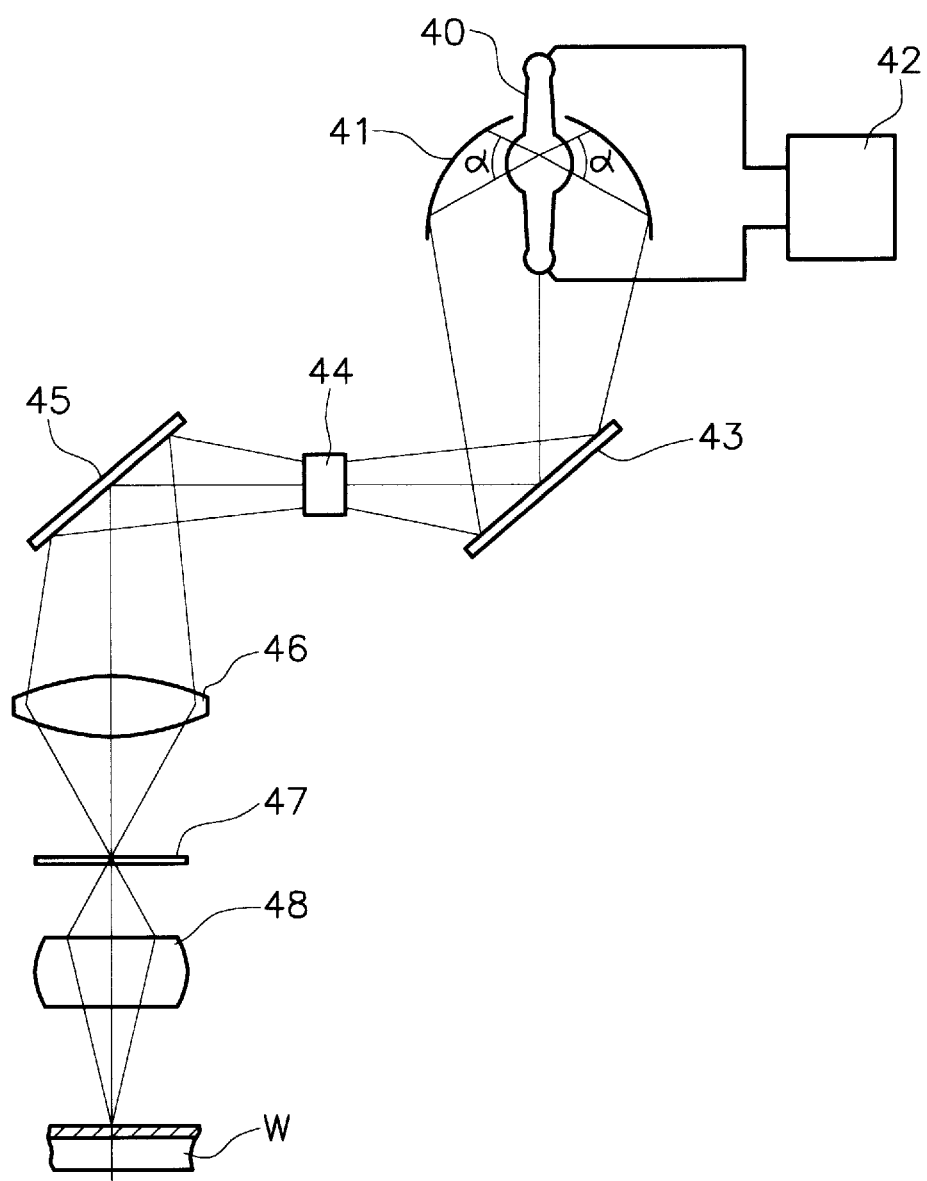
FIG. 4 shows a schematic of an exposure device in which the mercury lamp of the short arc type according to the invention is used.

FIG. 4 is a schematic of an exposure device for which the mercury lamp of the short arc type according to the invention is used.

In the drawing, a lamp 40 is located in a focussing mirror 41. The arc bright spot of lamp 40 is located in a first focal spot of focussing mirror 41. Power which is controlled by current source 42 is supplied to lamp 40.

The light reflected from the focussing mirror 41 and the light of an optical system directly projected by lamp 40 are supplied to photomask 47, which comprises a reflector 43, integrator lens 44, reflector 45 and condenser lens 46. A circuit pattern is projected which is drawn on this photomask 47 and is irradiated on wafer W via focussing lens 48.

In this case, lamp 40 undergoes vertical luminous operation, such that the cathode 20 is pointed down and the anode 30 is pointed up, as was described above. Light with an effective radiation angle α is routed in the direction to reflector 43 from arc bright spot T at the tip of the cathode and contributes to exposure of the above described wafer W. Light which is passed by the arc tube on the cathode side, outside of angle α, cannot be used for exposure.

Action of the Invention

As was described above, in the mercury lamp of the short arc type according to the invention, by placement of the taper on the rear end of the cathode, adhesion of the blackened substance produced during illumination can be concentrated in the vicinity of the hermetically sealed portion which does not contribute directly to the exposure.

Furthermore, the blackened substance can be most effectively produced in the vicinity of the hermetically sealed portion by the measure by which the angle of taper is in the range from 20° to 40°.

In addition, the portion of the radiant light from the lamp contributes to the exposure is shifted downward relative to the position of the entire lamp by the tip of the cathode projecting passed the center of the arc tube towards the anode side in the direction in which the electrodes extend.

Moreover, by winding the rod-shaped component on the cathode side with the tungsten coil, impurity gases can be adsorbed and formation of the blackened substance can be suppressed.

It is to be understood that although preferred embodiments of the invention have been described, various other embodiments and variations may occur to those skilled in the art. Any such other embodiments and variations which fall within the scope and spirit of the present invention are intended to be covered by the following claims.

What we claim is:

1. Mercury lamp of the short arc type having a power of at least 1 KW, comprising an arc tube in which a cathode electrode and an anode electrode are located next to one another which reach temperatures of about 2000° C. during luminous operation of the lamp, and in which opposite ends of the arc tube are provided with hermetically sealed portions; wherein the cathode electrode is disposed on the tip of a rod-shaped component which extends from a respective one of the hermetically sealed portions; wherein the outer diameter of the cathode electrode is greater than the outer diameter of said rod-shaped component; and wherein the back end of the cathode electrode tapers in a direction toward the respective hermetically sealed portion in a manner producing, during luminous operation of the lamp, a convection gas flow in a direction from the anode which causes deposition of vaporized electrode material to occur in proximity to the hermetically sealed portion from which the rod-shaped component supporting the cathode extends.

2. Mercury lamp of the short arc type according to claim 1, wherein back end of the cathode tapers at an angle which is in a range from 20° to 40° with regard to an axial direction of said rod-shaped component.

3. Mercury lamp of the short arc type according to claim 1, wherein the cathode extends passed a centerline of the emission part towards an anode side of the arc tube in an axial direction in which the rod-shaped components extend as a means for correspondingly shifting an arc bright spot which is formed therebetween.

4. Mercury lamp of the short arc type according to claim 1, wherein the rod-shaped component has a tungsten coil wound thereon.

5. Process for operating a mercury lamp of the short arc type, comprising an arc tube in which a cathode and an anode are located next to one another, and wherein opposite ends of the arc tube are provided with hermetically sealed portions, comprising the steps of selecting a cathode which has a greater outer diameter than an outer diameter of a rod-shaped component upon which it is to be installed and providing the cathode with a taper on a rear end thereof; installing the cathode on a tip of the rod-shaped component, with the rod-shaped component extending from a respective one of said hermetically sealed portions and with the taper on the rear end of the cathode directed toward the respective hermetically sealed portion; and producing illumination of the mercury lamp with a power of at least 1 kw and with the lamp oriented in a vertical direction with the cathode pointed down and the anode pointed up.

* * * * *

UNITED STATES PATENT AND TRADEMARK OFFICE
CERTIFICATE OF CORRECTION

PATENT NO. : 5,818,169
DATED : October 6, 1998
INVENTOR(S) : Shinkichi Morimoto, et. al.

It is certified that error appears in the above-identified patent and that said Letters Patent is hereby corrected as shown below:

Title page, item [75], inventors: change the third inventor's name from "Osamu Inoue" to -- Osamu Inque --.

Signed and Sealed this

Fifteenth Day of December, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.  : 5,818,169
DATED       : October 6, 1998
INVENTOR(S) : S. Morimoto et al It is certified that error appears in the above-identified patent and that said Letters Patent is hereby corrected as shown below:

This certificate supersedes Certificate of Correction issued December 15, 1998, the number should be deleted since no Certificate of Correction should have been issued.

Signed and Sealed this

Eleventh Day of May, 1999

Attest:

Q. TODD DICKINSON

Attesting Officer        Acting Commissioner of Patents and Trademarks